United States Patent
Kazama et al.

(10) Patent No.: US 9,210,388 B2
(45) Date of Patent: Dec. 8, 2015

(54) LASER SOURCE MODULE AND SCANNING IMAGE DISPLAY DEVICE EQUIPPED WITH SUCH MODULE

(75) Inventors: Atsushi Kazama, Hitachinaka (JP); Takeshi Nakao, Sagamihara (JP); Yasuo Amano, Yokohama (JP)

(73) Assignee: HITACHI-LG DATA STORAGE, INC., Tokyo (JP)

( * ) Notice: Subject to any disclaimer, the term of this patent is extended or adjusted under 35 U.S.C. 154(b) by 927 days.

(21) Appl. No.: 13/429,920

(22) Filed: Mar. 26, 2012

(65) Prior Publication Data

US 2013/0070206 A1     Mar. 21, 2013

(30) Foreign Application Priority Data

Sep. 20, 2011   (JP) .................... 2011-204198

(51) Int. Cl.
| | |
|---|---|
| H04N 9/31 | (2006.01) |
| G02B 19/00 | (2006.01) |
| G02B 26/10 | (2006.01) |
| G02B 27/09 | (2006.01) |
| H01S 5/40 | (2006.01) |
| H01S 5/022 | (2006.01) |
| H01S 5/024 | (2006.01) |

(52) U.S. Cl.
CPC .......... *H04N 9/3173* (2013.01); *G02B 19/0057* (2013.01); *G02B 26/101* (2013.01); *G02B 27/0905* (2013.01); *H01S 5/4012* (2013.01); *H04N 9/3129* (2013.01); *H04N 9/3144* (2013.01); *H04N 9/3164* (2013.01); *H01L 2224/48091* (2013.01); *H01L 2924/1461* (2013.01); *H01S 5/02212* (2013.01); *H01S 5/02469* (2013.01); *H01S 5/4093* (2013.01)

(58) Field of Classification Search
CPC ............. G03B 21/204; G03B 21/2046; G03B 21/2066; H04N 9/311
USPC .................................................. 353/20, 31, 98
See application file for complete search history.

(56) References Cited

U.S. PATENT DOCUMENTS

| | | | | |
|---|---|---|---|---|
| 2007/0229668 | A1* | 10/2007 | He et al. ........................ | 348/195 |
| 2011/0134395 | A1* | 6/2011 | Murata ........................... | 353/31 |
| 2012/0050690 | A1* | 3/2012 | Enomoto et al. ................ | 353/31 |

FOREIGN PATENT DOCUMENTS

| | | | | |
|---|---|---|---|---|
| JP | 6-314857 A | 8/1994 | | |
| JP | 2009-533715 A | 9/2009 | | |
| JP | WO 2010098363 | * 10/2010 | ............. | G03B 21/14 |
| WO | 2007/120831 A2 | 10/2007 | | |

* cited by examiner

*Primary Examiner* — William C Dowling
*Assistant Examiner* — Jerry Brooks
(74) *Attorney, Agent, or Firm* — Mattingly & Malur, PC (57) ABSTRACT

In a laser source module aligning laser beams from laser sources for three colors, red, green, and blue on a single combined beam optical axis, decreasing relative displacements of beam spots of three colors, occurring due to thermal deformation by temperature rise, is achieved by a laser source module including plural laser sources, each incorporating a laser having a laser chip installed on a heat sink and a lens converting a light radiated from the laser into a laser beam, and a beam combining unit aligning the laser beams from the laser sources on a single combined beam optical axis, wherein the lasers in at least two or more ones of the laser sources are arranged so that their laser beams will be decentered toward a same direction on the combined beam optical axis upon displacement of an emission point of the laser chip away from the heat sink.

30 Claims, 5 Drawing Sheets

LASER SOURCE MODULE AND SCANNING IMAGE DISPLAY DEVICE EQUIPPED WITH SUCH MODULE

CLAIM OF PRIORITY

The present application claims priority from Japanese patent application serial No. 2011-204198 filed on Sep. 20, 2011, the content of which is hereby incorporated by reference into this application

BACKGROUND OF THE INVENTION

1. Field of the Invention

The present invention relates to a laser source module that aligns laser beams from a plurality of laser sources on a single optical axis for laser beam emission and a scanning image display device that displays an image on screen by two-dimensionally scanning a laser beam from the laser source module with a scanning mirror.

2. Description of the Related Art

Lately, developing small projectors that are handily portable and can display on a large screen is actively pursued. Small projectors that can be connected to a notebook PC or the like and video cameras with a built-in projector that can project recorded images, among others, are commercially available. Such a projector built in a mobile phone or a smart phone is expected to appear from here on.

Projectors of a preceding type use lamps or LEDs as light sources and project an image displayed by a liquid crystal panel or digital micro mirror device (DMD). However, development of laser projectors (scanning image display devices) is underway that use lasers as light sources and scan a single laser beam with movable mirrors to make a display. Because of using laser lights as the light sources, no focusing is needed. The laser projectors are considered to be fit for usage in which a user projects an image on a suitable wall anywhere he or she visits.

In Japanese Translation of PCT International Application Publication No. 2009-533715 (Patent Document 1), there is a description about a configuration of a scanning image display device capable of displaying a color image. This scanning image display device uses laser sources for three colors, i.e., red, blue, and green, and includes a beam combining unit that combines laser beams of the three colors into a combined beam traveling along a single axis and a beam scanner that scans the combined beam in deflection directions.

The beam combining unit is configured such that three laser sources arranged in parallel emit beams in a same direction and the beams are reflected by their respective beam combining mirrors and combined into a combined beam. An alternative configuration is also described in which one laser source is initially configured to emit a beam along the optical axis of the combined beam and only two beam combining mirrors are provided. It can be considered that a smaller module is possible because of fewer mirrors.

Since there was no laser that radiates a green light directly until quite recently, in Patent Document 1, a green light is still produced by wavelength conversion of an infrared light using SHG (second harmonic generation). However, even a laser that radiates a green light directly has been available lately.

For the scanning image display devices as mentioned above, it is important to align the optical axes of the laser beams of the three colors precisely. Misalignment or decentering of the optical axes gives rise to relative displacements of the spots of the respective colors on screen, resulting in a blurred image. Module assembly work entails making an adjustment to align the optical axes of the laser beams of the three colors.

Moreover, when a scanning image display device is used, its temperature rises mainly due to heat generated by the lasers, causing thermal deformation. Therefore, considerations also need to be taken for decentering of the optical axes due to the displacements of optical components when thermally deformed.

As a laser that is used as a light source, a cylindrical metal package product called a CAN package prevails. This product has a structure in which a half-cylindrical heat sink is coupled onto the front face of a cylindrical base, a laser chip is joined to the planar face of the heat sink with intermediate positioning of a sub-mount, and this assembly is covered by a cap.

As described in Japanese Published Unexamined Patent Application No. Hei 6-314857 (Patent Document 2), such a laser source suffers from a problem in which an emission point is displaced due to deformation by temperature rise. This is due to the fact that the base and heat sink have different coefficients of thermal expansion or the laser chip, sub-mount, and heat sink have different coefficients of thermal expansion, thus causing uneven thermal deformations of these elements. Since the direction of the optical axis of a laser beam from a laser source corresponds to the direction of a line connecting the emission point of the laser and the center of its lens, the optical axis of the laser beam is decentered when the emission point is displaced.

Patent Document 2 discloses a structure in which a cylindrical joint is used to join the heat sink to the base, thus preventing the emission point displacement as above. However, such a structure is not adopted in easily available laser products at present and the problem of the emission point displacement remains.

An object of the present invention is to provide a small laser source module capable of decreasing relative displacements of spots on screen even in the occurrence that the emission points of lasers are displaced because of temperature rise and a scanning image display device equipped with such module.

SUMMARY OF THE INVENTION

To solve the problem as discussed above, a laser source module of the present invention is configured as follows.

The above object is achieved in the following manner: in a laser source module including a plurality of laser sources, each including a laser having a laser chip installed on a heat sink and a lens for converting a radiated light from the laser into a laser beam, and a beam combining unit for aligning the laser beams from the plurality of laser sources on a single combined beam optical axis, the lasers in at least two or more ones of the laser sources are arranged so that their laser beams are to be decentered toward a same direction on the combined beam optical axis upon displacement of an emission point of the laser chip away from the heat sink.

Preferably, the beam combining unit may include one or more mirrors capable of reflecting or transmitting the laser beam depending on a wavelength and a direction of polarization and, in at least two or more ones of the laser sources, between a laser source emitting a beam that undergoes an odd number of times of reflection by a mirror that inverts a decentering direction of a laser beam decentered upon the displacement of the emission point of the laser chip away from the heat sink and a laser source emitting a beam that undergoes an even number of times of such reflection or no reflection, the laser chip and the heat sink may be positioned reversely relative to a beam emission direction.

Preferably, the beam combining unit may include one or more mirrors capable of reflecting or transmitting the laser beam depending on a wavelength and a direction of polarization, a plane on which main beam light paths including the combined beam optical axis are formed may be assumed to be a light path plane, and in at least two or more ones of the laser beam sources, in which the laser chip and the heat sink are arranged within the light path plane, between a laser beam source emitting a beam that undergoes an odd number of times of reflection by a mirror during passing through the beam combining unit and a laser beam source emitting a beam that undergoes an even number of times of reflection or no reflection, the laser chip and the heat sink may be positioned reversely relative to a beam emission direction within the light path plane.

The above object is achieved in the following manner: in a laser source module including a first laser beam source, a second laser beam source, and a third laser beam source, each comprising a laser having a laser chip installed on a heat sink and a lens for making a radiated light from the laser into a laser beam, and a beam combining unit for aligning laser beams emitted from respective laser sources on a single combined beam optical axis, the beam combining unit includes one or more mirrors capable of reflecting or transmitting a beam depending on a wavelength and a direction of polarization, a plane on which main beam light paths including the combined beam optical axis are formed is assumed to be a light path plane, and, in at least two or more ones of the laser beam sources, in which the laser chip and the heat sink are arranged within the light path plane, between a laser beam source emitting a beam that undergoes an odd number of times of reflection by a mirror during passing through the beam combining unit and a laser beam source emitting a beam that undergoes an even number of times of reflection or no reflection, the laser chip and the heat sink are positioned reversely relative to a beam emission direction within the light path plane.

Preferably, the beam combining unit may include a first mirror and a second mirror, a laser beam from the first laser beam source may be reflected by the first mirror and aligned on the combined beam optical axis, a laser beam from the second laser beam source may be reflected by the second mirror, then pass through the first mirror, and be aligned on the combined beam optical axis, a laser beam from the third laser beam source may pass through the second mirror and the first mirror and be aligned on the combined beam optical axis, and, between the first and second laser beam sources and the third laser beam source, the laser chip and the heat sink may be positioned reversely relative to a beam emission direction within the light path plane.

Preferably, the beam combining unit may include a first mirror and a second mirror, a laser beam from the first laser beam source may pass through the first mirror and be aligned on the combined beam optical axis, a laser beam from the second laser beam source may be reflected by the second mirror, then reflected by the first mirror, and aligned on the combined beam optical axis, a laser beam from the third laser beam source may pass through the second mirror, then be reflected by the first mirror, and aligned on the combined beam optical axis, and, between the first and second laser beam sources and the third laser beam source, the laser chip and the heat sink may be positioned reversely relative to a beam emission direction within the light path plane.

Preferably, the first laser beam source may emit a blue laser beam, the second laser beam source may emit a red laser beam, and the third laser beam source may emit a green laser beam.

Preferably, by employing a laser source module as described above in combination with a scanning mirror capable of scanning a reflection direction of a laser beam aligned on the combined beam optical axis in two axis directions, a scanning image display device that displays an image on screen by controlling emission of the laser sources and scanning of the scanning mirror synchronously is configured.

According to the present invention, even when the temperature of a laser source module has risen mainly due to heat generated by lasers, the decentering directions of the optical axes of laser beams emitted from a plurality of laser sources, decentered due to thermal deformation of the lasers, can be made to coincide on the combined beam optical axis. Thus, it is possible to provide a scanning image display device equipped with a laser source module improved to decrease relative displacements of laser spots on screen.

DETAILED DESCRIPTION OF PREFERRED EMBODIMENTS

In the following, exemplary embodiments of the present invention will be described with the aid of the drawings.

Exemplary Embodiment 1

Figure 1:
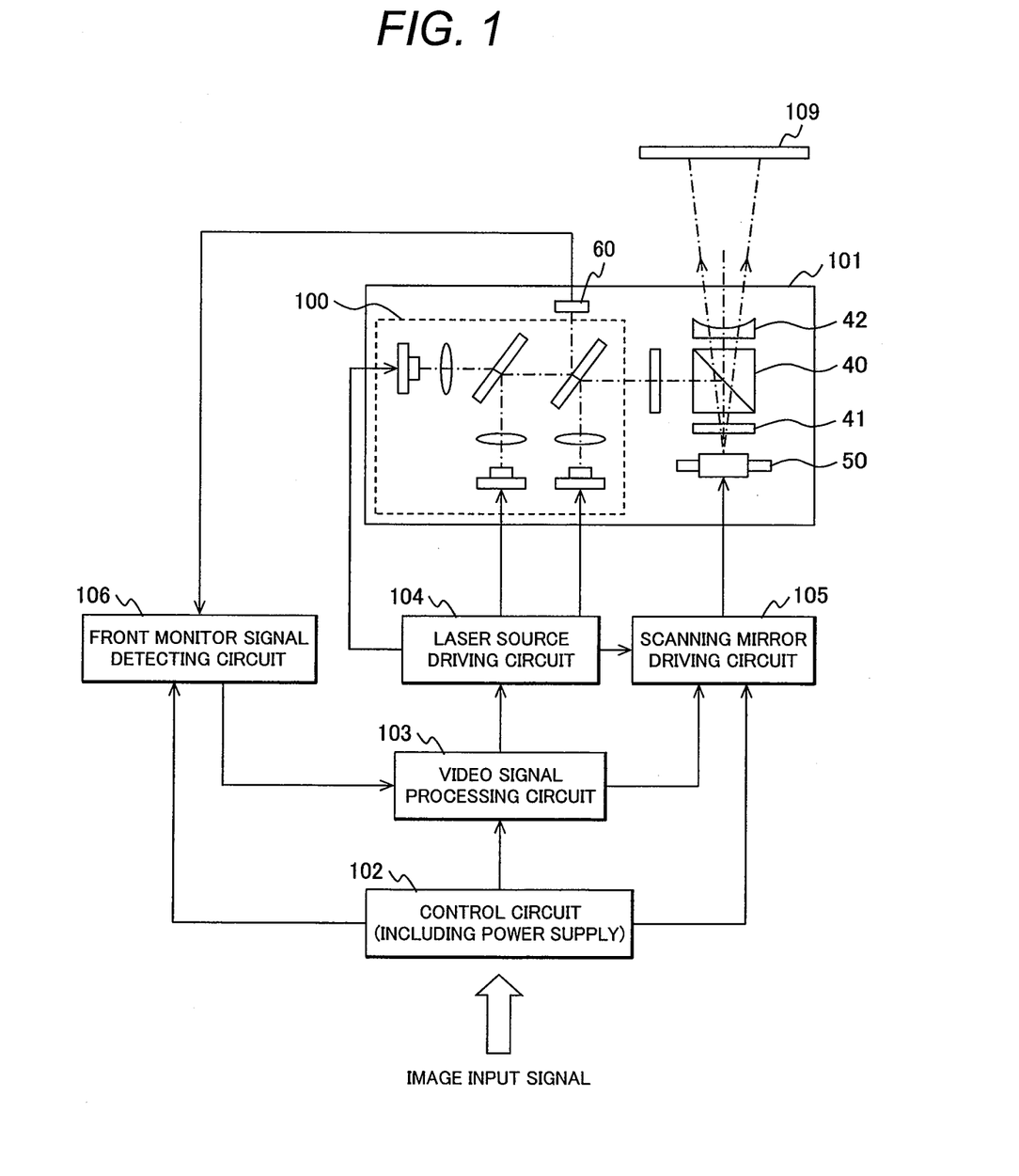
FIG. 1 is an overall structural diagram of a scanning image display device pertaining to the present invention.

FIG. 1 is an overall structural diagram of a scanning image display device pertaining to the present invention.

In FIG. 1, an optics module unit 101 includes a laser source module 100 (which will be detailed later) incorporating laser sources for three colors, i.e., green (G), red (R), and blue (B), and a beam combining unit for combining laser beams emitted from the respective laser sources, a projection unit which projects a combined laser beam onto a screen 109, and a scanning unit which two-dimensionally scans the projection laser beam on the screen 109. The projection unit includes a polarized beam splitter (PBS) 40, a ¼ wavelength plate 41, and an angle of view widening element 42, while the scanning unit includes a scanning mirror 50.

An image signal to be displayed is input to a video signal processing circuit 3 via a control circuit 2 including a power supply, etc. The video signal processing circuit 3 performs various processing operations on the image signal and, furthermore, disassembles the image signal into three color signals of R, G, and B and sends these signals to a laser source driving circuit 104. The laser source driving circuit 104 supplies the corresponding lasers in the laser source module 100 with drive currents for beam emission according to the brightness values of the individual R, G, and B signals. In consequence, the lasers emit laser beams whose intensity varies depending on the brightness values of the R, G, and B signals in synchronization with display timing.

The video signal processing circuit 103 also extracts synchronization signals from the image signal and sends them to a scanning mirror driving circuit 105. In accordance with horizontal and vertical synchronization signals, the scanning mirror driving circuit 105 supplies the scanning mirror 50 in the optics module unit 101 with a drive signal causing a reciprocating turn in two dimensions of the mirror plane. Thereby, the mirror plane of the scanning mirror 50 makes a reciprocating turn only by a predetermined angle periodically and reflects the laser beam, so that beam scanning in horizontal and vertical directions takes place on the screen 109 to display an image.

A front monitor signal detecting circuit 106 takes input of a signal from a front monitor 60 and detects respective R, G, and B output levels emitted from the lasers. The detected output levels are input to the video signal processing circuit 103 and the outputs of the lasers are controlled to provide predetermined outputs.

For the scanning mirror 50, for example, a two-axis driven mirror manufactured by using a MEMS (Micro Electromechanical Systems) technology can be used. As for driving methods, inter alia, piezoelectric, electrostatic, and electromagnetic driving methods may be adopted. Alternatively, two one-axis driven mirrors may be provided and disposed to enable beam scanning in mutually orthogonal directions.

By the way, the laser sources used in the scanning image display device of this type suffer from a problem in which the emission points of the lasers are displaced by thermal deformation and the directions of the optical axes of laser beams emitted by them are decentered, as noted previously. The decentering of the optical axes of the laser beams results in displacements of the spots on screen. When the three laser sources produce different spot displacements, the spots do not coincide in position, resulting in a blurred image.

The inventors of the present invention worked out configuring the laser source module 100 such that the spots produced by the multiple laser sources are displaced in a same direction, thereby making it possible to decrease the amounts of relative displacements and, consequently, achieved embodiments as will be described below.

In the following, descriptions are provided about the laser source module 100 pertaining to the present invention.

Figure 2:
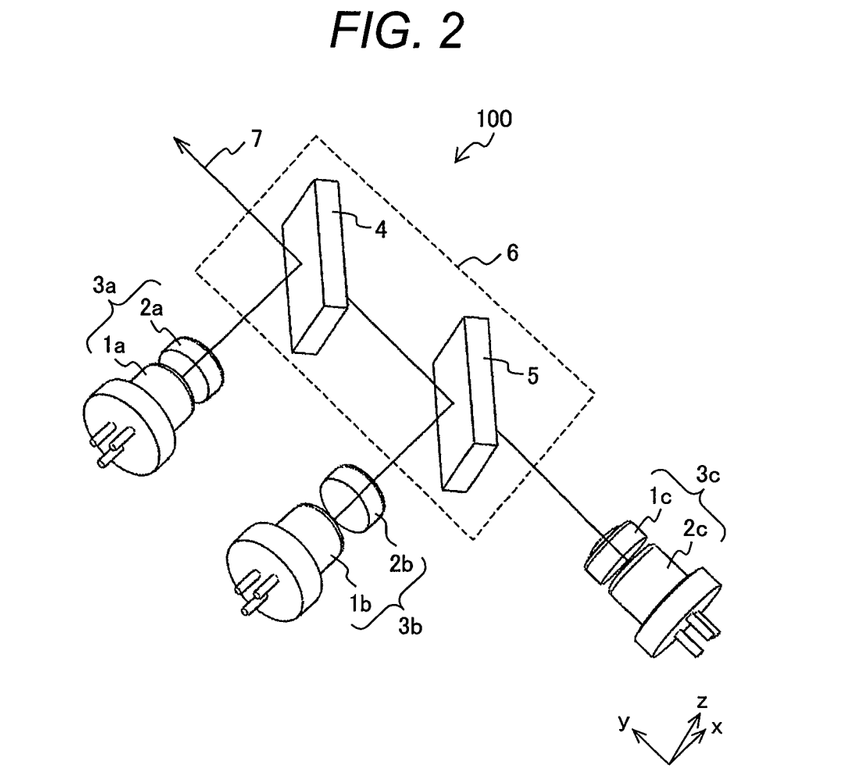
FIG. 2 is a perspective view depicting an exemplary embodiment of a laser source module pertaining to the present invention.

FIG. 2 is a perspective view for explaining the laser source module pertaining to a first exemplary embodiment of the present invention.

In FIG. 2, the laser source module 100 incorporates a first laser source 3a constituted by a first laser 1a and a first lens 2a, a second laser source 3b constituted by a second laser 1b and a second lens 2b, a third laser source 3c constituted by a third laser 1c and a third lens 2c, and a beam combining unit 6 constituted by a first mirror 4 and a second mirror 5.

The first laser 1a, second laser 1b, and third laser 1c radiate red, green, and blue (R, G, and B) laser lights, respectively. The first lens 2a, second lens 2b, and third lens 2c are so-called collimators and make the laser lights radiated from the respective laser sources into substantially parallel laser beams. The laser beams from the laser sources are aligned on a single combined beam optical axis 7 in the beam combining unit 6 and are radiated outside the laser source module 100.

A blue laser beam from the first laser source 3a is reflected by the first mirror 4, a red laser beam from the second laser source 3b is reflected by the second mirror 5 and then passes through the first mirror 4, and a green laser beam from the third laser source 3c passes through the second mirror 5 and the first mirror 4 in order. Then, these laser beams are aligned on the combined beam optical axis 7. In order to form such light paths, the first mirror 4 and the second mirror 5 are dichroic mirrors designed so that the first mirror 4 reflects a beam with a blue wavelength and transmits beams with red and green wavelengths and the second mirror 5 reflects a beam with a red wavelength and transmits a beam with a green wavelength.

Figure 3A:
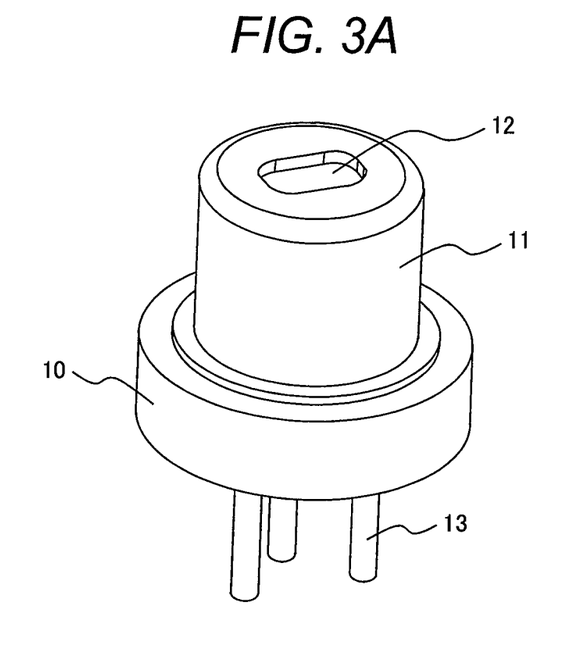
FIGS. 3A and 3B are perspective views depicting an overview of a laser that is used in the present invention.
Figure 3B:
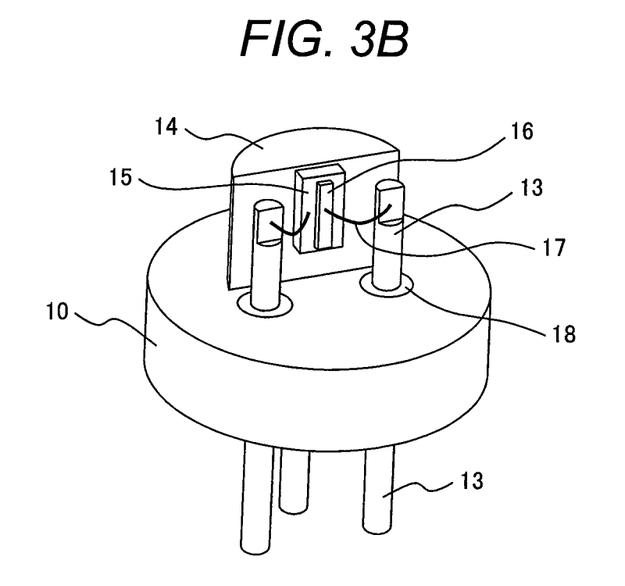

FIGS. 3A and 3B are perspective views, each depicting a laser structure that can be used as the first laser 1a, second laser 1b, and third laser 1c.

In FIG. 3A, a laser structure is shown in which the laser is protected by a stem base 10, a stem cover 11, and a transparent window 12 provided at the top of the stem cover 11. Behind the stem base 10, leads 13 for feeding power to the laser extend.

FIG. 3B shows the laser structure with the stem cover 11 and the window 12 excluded to explain the internal structure of the laser.

In FIG. 3B, a heat sink 14 having a cut cylindrical shape is joined to the columnar stem base 10 and a laser chip 16 is joined to its planar face with intermediate positioning of a sub-mount 15. The laser is configured such that an emission point located on the top end face of the laser chip 16 is positioned on a substantially center line of the laser. The leads 13 penetrate the stem base 10 and protrude inside the stem cover 11. The leads 13 and the laser chip 16 are connected via wires 17. Sealing between the leads 13 and the stem base 10 is provided by an insulating sealing material 18.

As for materials of these elements, for example, gallium arsenic is used for the laser chip 16, aluminum nitride for the sub-mount 15, cupper for the heat sink 14, iron for the stem base 10 and stem cover 11, glass for the window 12, and low-melting-point glass for the sealing material 18.

In FIG. 2, it is assumed that a direction in which beams are emitted by the first laser source 3a and second laser source 3b is an X direction and a direction in which beams are emitted by the third laser source 3c is a Y direction, and an X-Y plane is referred to as a light path plane 19.

Figure 4:
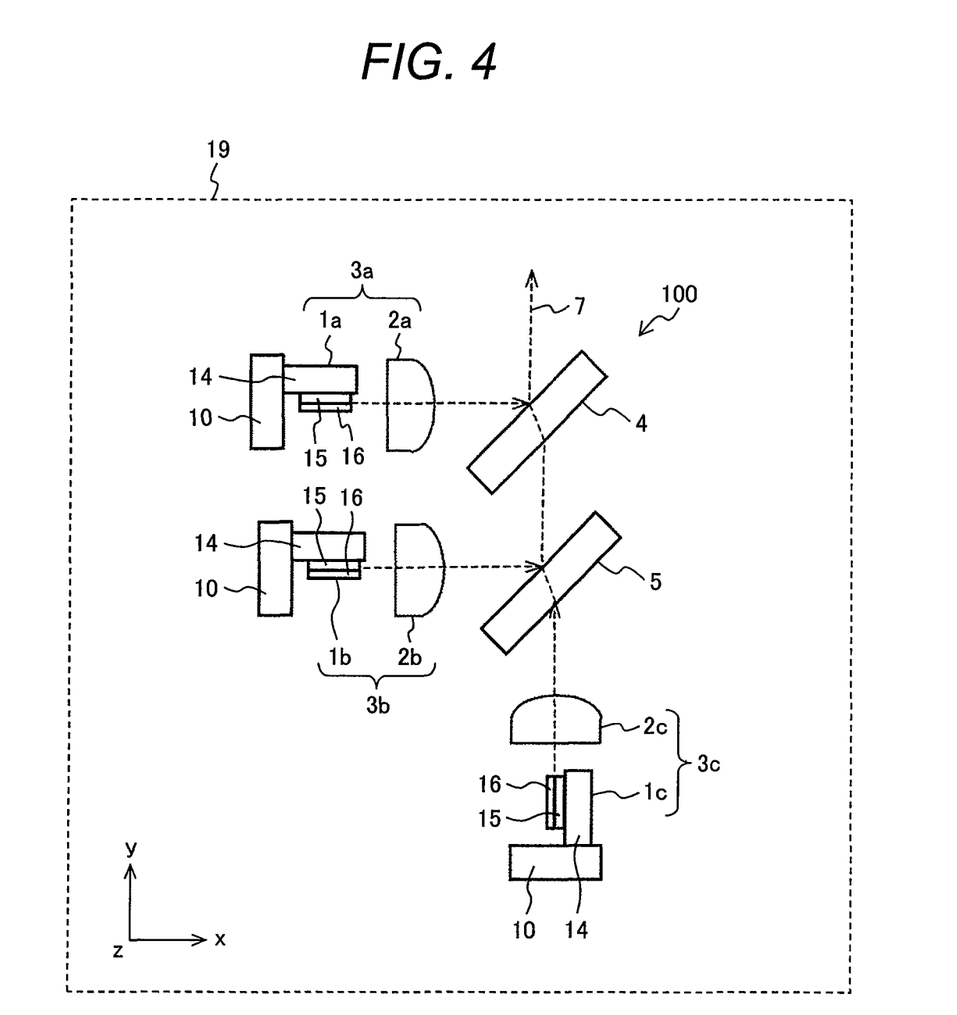
FIG. 4 is a plan view depicting a first exemplary embodiment of the laser source module pertaining to the present invention.

FIG. 4 is a plan view depicting how the lasers, lenses, and mirrors are arranged on the light path plane 19.

In each laser, the stem base 10, heat sink 14, sub-mount 15, and laser chip 16 are only shown.

As a feature of the present invention; in FIG. 4, for the first laser source 3a and second laser source 3b, the heat sink 14 is positioned at left and the laser chip 16 at right with respect to the laser beam emission direction, whereas, for the third laser source 3c, the laser chip 16 is positioned at left and the heat sink 14 at right with respect to the laser beam emission direction, where the positioning of the heat sink 14 and the laser chip 16 is opposite to that for the first and second laser sources.

By this configuration, even if the temperature of the laser source module 100 rises mainly because of heat generated by the lasers, directions in which the optical axes of the laser beams are decentered due to thermal deformation of the lasers, occurring in the first laser source 3a, second laser source 3b, and third laser source 3c, can be aligned in a same direction on the combined beam optical axis 7. Consequently, it is possible to decrease relative displacements of the spots of the respective colors, when laser beams are projected onto the screen.

The laser is constituted by the elements having different coefficients of thermal expansion, as mentioned above, and undergoes thermal deformation because of temperature rise. Because the coefficient of thermal expansion of the heat sink 14 is larger than that of the laser chip 16 and the sub-mount 15, warping occurs and the emission point of the laser chip 16 is displaced away from the heat sink 14. The laser beam travels in the direction of a straight line connecting the emission point of the laser chip 16 and the center of the lens (2a to 2c). Hence, when the displacement as above occurs in the emission point of the laser chip 16, the direction in which the laser beam travels is decentered off its initial direction toward the side of the heat sink 14.

In the present exemplary embodiment, laser beams from the first laser source 3a and the second laser source 3b, which travel in a positive direction of the X axis, are decentered leftward with respect to their travel direction, that is, toward a positive direction of the Y axis. On the other hand, a laser beam from the third laser source 3c, which travels in a positive direction of the Y axis, is decentered rightward with respect to its travel direction, that is, toward a positive direction of the X axis. Such decentering direction inverts when the beam is reflected by the first mirror 4 or the second mirror 5 and remains the same when the beam passes through the mirror.

Therefore, the decentering direction of a laser beam from the first laser source 3a, after the beam is reflected by the first mirror, turns rightward with respect to its travel direction, that is, toward a positive direction of the X axis. The decentering direction of a laser beam from the second laser source 3b, after the beam is reflected by the second mirror, turns rightward with respect to its travel direction, that is, toward a positive direction of the X axis, and, after the beam passes through the first mirror, its decentering direction remains the same. The decentering direction of a laser beam from the third laser source 3b remains the same after the beam passes through the second mirror and the first mirror.

Thus, the decentering directions of all the laser beams from the first laser source 3a, second laser source 3b, and third laser source 3c on the combined beam optical axis 7 become rightward with respect to their travel direction, that is, toward a positive direction of the X axis. The decentering directions can be aligned in the same direction.

The amounts of decentering of the laser beams are not always equal because of a difference in the structures of the lasers and a difference in the distance between the emission point of the laser chip 16 and the center of the lens, among others. Nevertheless, relative displacements of spots can be decreased significantly if all the beams can be coordinated to be decentered in the same direction, as compared with a case where the decentering direction of one beam is opposite to that of another beam.

Because the purpose is to align the decentering directions of the laser beams, the elements of all the lasers may be installed in reverse positions. That is, the lasers may be arranged as follows: for the first laser source 3a and the second laser source 3b, the heat sink 14 is positioned at right and the laser chip 16 at left; for the third laser source 3c, the heat sink 14 is positioned at left and the laser chip 16 at right.

Since the decentering direction of a laser beam inverts by being reflected by a mirror, as noted previously, by installing the lasers so that the optical axis of a laser beam from the first laser source 3a and the second laser source 3b, which is reflected once by a mirror, is decentered rightward with respect to its travel direction, whereas the optical axis of a laser beam from the third laser source 3c, which is not reflected by a mirror, is decentered leftward with respect to its travel direction, it was made possible to align the decentering directions of the laser beams on the combined beam optical axis 7.

In similar different configurations not limited to the configuration of the first exemplary embodiment, between a laser source emitting a laser beam that undergoes an odd number of times of reflection by mirror until reaching the combined beam optical axis 7 and a laser source emitting a laser beam that undergoes an even number of times of reflection or no reflection, by making the decentering directions of both of the laser beams opposite to each other with respect to their travel direction, that is, positioning the heat sink 14 and the laser chip 16 reversely, an effect of decreasing relative displacements of spots can be achieved.

Exemplary Embodiment 2

By way of example, a second exemplary embodiment is illustrated in which light paths up to the combined beam optical axis 7 differ from those in the first exemplary embodiment.

Figure 5:
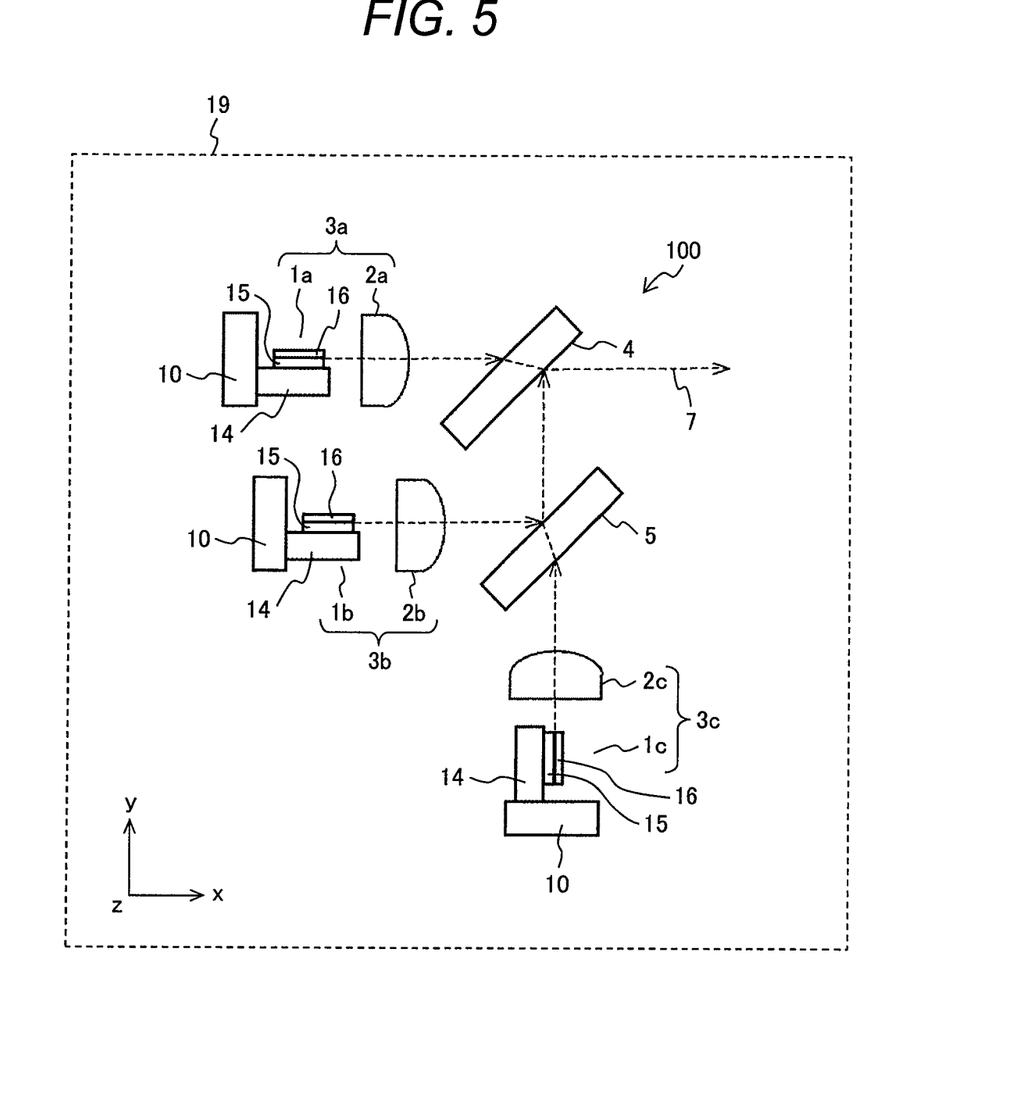
FIG. 5 is a plan view depicting a second exemplary embodiment of the laser source module pertaining to the present invention.

FIG. 5 is a plan view depicting a configuration of the laser source module 100 on the light path plane 19 according to the second exemplary embodiment.

In FIG. 5, a blue laser beam from the first laser source 3a passes through the first mirror 4, a red laser beam from the second laser source 3b is reflected by the second mirror 5 and then reflected by the first mirror 4, and a green laser beam from the third laser source 3c passes through the second mirror 5 and is then reflected by the first mirror 4. Then, these laser beams are aligned on the combined beam optical axis 7. In order to form such light paths, the first mirror 4 is designed to transmit a beam with a blue wavelength and reflect beams with red and green wavelengths. The second mirror 5 is designed to reflect a beam with a red wavelength and transmit a beam with a green wavelength.

In the present exemplary embodiment, a laser beam from the first laser source 3a is not reflected by mirror, while a laser beam from the second laser source 3b is reflected twice and a laser beam from the third laser source 3c is reflected once. Accordingly, the lasers are arranged so that a laser beam from the third laser source 3c, which undergoes an odd number of times of reflection by mirror, is decentered leftward with respect to its travel direction, and laser beams from the first laser source 3a and the second laser source 3b, which undergo an even number of times of reflection by mirror or not reflection, are decentered rightward with respect to their travel direction.

That is, the lasers are arranged as follows: for the third laser source 3c, the heat sink 14 is positioned at left and the laser chip 16 at right; for the first laser source 3a and the second laser source 3b, the heat sink 14 is positioned at right and the laser chip 16 at left. Thereby, all laser beams on the combined beam optical axis 7 going toward a positive direction of the X axis come to be decentered rightward with respect to their travel direction, that is, toward a minus direction of the Y axis, and it was made possible to align the decentering directions.

Because the present invention is intended to align the decentering directions of the laser beams, the elements of all the lasers may be installed in reverse positions. That is, the lasers may be arranged as follows: for the third laser source 3c, the heat sink 14 is positioned at right and the laser chip 16 at left; for the first laser source 3a and the second laser source 3b, the heat sink 14 is positioned at left and the laser chip 16 at right.

It is also conceivable that a laser is arranged such that the laser chip 16 and the heat sink 14 are arranged out of the light path plane 19. In such a case, the optical axis of a laser beam is decentered toward a direction out of the light path plane 19 when the emission point of the laser chip 16 is displaced away from the heat sink 14 and beam reflection by the first mirror 4 or the second mirror 5 does not invert the decentering direction.

Even in a case where a laser source is included that is arranged such that the laser chip 16 and the heat sink 14 are arranged out of the light path plane 19, as for at least other laser sources in which the laser chip 16 and the heat sink 14 are arranged within the light path plane 19, relative displacements of spots can be decreased by applying the above arrangement of the lasers so as to align the decentering directions of laser beams on the combined beam optical axis 7.

However, in order to obtain coincidence of the spot shapes of laser beams of the respective colors, it is desirable that all lasers are installed such that the laser chip 16 and the heat sink 14 are arranged within the light path plane 19. This is because the spread shape (far field pattern) of a laser beam emitted from the laser chip 16 at a sufficient distance is known to be an elliptical shape with a long axis in a direction of the thickness of the laser chip 16 and, if a laser that directs a beam out of the light path plane 19 is included, a blurred image is liable to occur due to misalignment of the long axis directions of elliptical spots.

In the exemplary embodiments described above, it has been assumed that the first laser source 3a emits a blue laser beam, the second laser source 3b emits a red laser beam, and the third laser source 3c emits a green laser beam. However, the arrangement of blue, red, and green is not limited to this and, even if another arrangement is adopted, it is possible to decrease relative displacements of spots by applying the configuration of the present invention.

Although three laser sources are generally used for full color display, two laser sources or more than three laser sources including an additional auxiliary one may be used in some conceivable cases depending on application. Even in such cases, relative displacements of spots can be decreased by applying the configuration of the present invention.

According to the present invention, as described hereinbefore, in the laser source module that aligns laser beams from the laser sources for three colors, red, green, and blue on a single combined beam optical axis, it is possible to decrease relative displacements of the beam spots of the three colors occurring due to thermal deformation by temperature rise.

What is claimed is:

1. A laser source module comprising:
a plurality of laser sources which generate a plurality of laser beams, each including a laser having a laser chip installed on a heat sink and a lens for converting a radiated light from the laser into one of the respective laser beams; and
a beam combining unit to align the laser beams from the plurality of laser sources on a single combined beam optical axis,
wherein an optical axis of each of the respective laser beams in at least two of the laser sources decenter towards a predetermined orthogonal direction from the combined beam optical axis according to an operating condition of the laser sources, and
wherein the lasers in the at least two of the laser sources are arranged so that the respective laser beams thereof decenter towards a same direction from the combined beam optical axis upon displacement of an emission point of the respective laser chips away from the respective heat sinks in the at least two of the laser sources.

2. The laser source module according to claim 1,
wherein the beam combining unit includes one or more mirrors which reflect or transmit the laser beams from the laser sources depending on a wavelength and a direction of polarization thereof, and
wherein, in the at least two of the laser sources, between a one of the laser sources emitting the laser beam that undergoes an odd number of times of reflection by a mirror that inverts a decentering direction of the laser beam decentered upon the displacement of the emission point of the laser chip away from the heat sink and another one of the laser sources emitting the laser beam that undergoes an even number of times of reflection or no reflection, the laser chips and the heat sinks thereof are positioned reversely relative to respective beam emission directions.

3. The laser source module according to claim 1,
wherein the beam combining unit includes one or more mirrors which reflect or transmit the laser beams from the laser sources depending on a wavelength and a direction of polarization thereof,
wherein the laser beams emitted from the laser sources and the combined beam optical axis are disposed on a light path plane, and
wherein, in the at least two of the laser sources, in which the laser chips and the heat sinks thereof are arranged within the light path plane, between one of the laser sources emitting the laser beam that undergoes an odd number of times of reflection by a mirror while passing through the beam combining unit and another of the laser sources emitting the laser beam that undergoes an even number of times of reflection or no reflection, the laser chips and the heat sinks thereof are positioned reversely relative to respective beam emission directions within the light path plane.

4. A laser source module comprising:
a first laser beam source, a second laser beam source, and a third laser beam source, each respectively including a laser having a laser chip installed on a heat sink and a lens for making a radiated light from the laser into a laser beam; and
a beam combining unit to align the laser beams respectively emitted from the first laser beam source, second laser beam source, and third laser beam source on a single combined beam optical axis,
wherein an optical axis of the respective laser beams of at least two of the laser beam sources, selected from the first laser beam source, second laser beam source, and third laser beam source, decenter towards a predetermined orthogonal direction from the combined beam optical axis according to an operating condition of the first laser beam source, second laser beam source, and third laser beam source,
wherein the beam combining unit comprises one or more mirrors which reflect or transmit the laser beams from the first laser beam source, second laser beam source, and third laser beam source depending on a wavelength and a direction of polarization thereof,
wherein the laser beams emitted from the first laser beam source, second laser beam source, and third laser beam source and the combined beam optical axis are disposed in a light path plane, and
wherein, in the at least two of the laser beam sources selected from the first laser beam source, second laser beam source, and third laser beam source, in which the laser chips and the heat sinks thereof are arranged within the light path plane, between one of the at least two laser beam sources emitting the laser beam that undergoes an odd number of times of reflection by a mirror while passing through the beam combining unit and another of the at least two laser beam sources emitting the laser beam that undergoes an even number of times of reflection or no reflection, the laser chips and the heat sinks thereof are positioned reversely relative to respective beam emission directions within the light path plane.

5. The laser source module according to claim 4,
wherein the one or more mirrors of the beam combining unit includes a first mirror and a second mirror,
wherein the laser beam from the first laser beam source is reflected by the first mirror and aligned on the combined beam optical axis,
wherein the laser beam from the second laser beam source is reflected by the second mirror, then is transmitted through the first mirror, and is aligned on the combined beam optical axis,
wherein the laser beam from the third laser beam source is transmitted through the second mirror and the first mirror and is aligned on the combined beam optical axis, and
wherein, between the first and second laser beam sources and the third laser beam source, the laser chips and the heat sinks thereof are positioned reversely relative to respective beam emission directions within the light path plane.

6. The laser source module according to claim 4,
wherein the one or more mirrors of the beam combining unit includes a first mirror and a second mirror,
wherein the laser beam from the first laser beam source is transmitted through the first mirror and is aligned on the combined beam optical axis,
wherein the laser beam from the second laser beam source is reflected by the second mirror, then reflected by the first mirror, and aligned on the combined beam optical axis,
wherein the laser beam from the third laser beam source is transmitted through the second mirror, then is reflected by the first mirror, and aligned on the combined beam optical axis, and
wherein, between the first and second laser beam sources and the third laser beam source, the laser chips and the heat sinks thereof are positioned reversely relative to respective beam emission directions within the light path plane.

7. The laser source module according to claim 5,
wherein the first laser beam source emits a blue laser beam, the second laser beam source emits a red laser beam, and the third laser beam source emits a green laser beam.

8. The laser source module according to claim 6,
wherein the first laser beam source emits a blue laser beam, the second laser beam source emits a red laser beam, and the third laser beam source emits a green laser beam.

9. A scanning image display device comprising the laser source module according to claim 1 and a scanning mirror capable of scanning a reflection direction of a laser beam aligned on the combined beam optical axis in two axis directions, wherein the scanning image display device displays an image on screen by controlling emission of the laser sources and scanning of the scanning mirror synchronously.

10. A scanning image display device comprising the laser source module according to claim 2 and a scanning mirror capable of scanning a reflection direction of a laser beam aligned on the combined beam optical axis in two axis directions, wherein the scanning image display device displays an image on screen by controlling emission of the laser sources and scanning of the scanning mirror synchronously.

11. A scanning image display device comprising the laser source module according to claim 3 and a scanning mirror capable of scanning a reflection direction of a laser beam aligned on the combined beam optical axis in two axis directions, wherein the scanning image display device displays an image on screen by controlling emission of the laser sources and scanning of the scanning mirror synchronously.

12. A scanning image display device comprising the laser source module according to claim 4 and a scanning mirror capable of scanning a reflection direction of a laser beam aligned on the combined beam optical axis in two axis directions, wherein the scanning image display device displays an image on screen by controlling emission of the laser sources and scanning of the scanning mirror synchronously.

13. A scanning image display device comprising the laser source module according to claim 5 and a scanning mirror capable of scanning a reflection direction of a laser beam aligned on the combined beam optical axis in two axis directions, wherein the scanning image display device displays an image on screen by controlling emission of the laser sources and scanning of the scanning mirror synchronously.

14. A scanning image display device comprising the laser source module according to claim 6 and a scanning mirror capable of scanning a reflection direction of a laser beam aligned on the combined beam optical axis in two axis directions, wherein the scanning image display device displays an image on screen by controlling emission of the laser sources and scanning of the scanning mirror synchronously.

15. A scanning image display device comprising the laser source module according to claim 7 and a scanning mirror capable of scanning a reflection direction of a laser beam aligned on the combined beam optical axis in two axis directions, wherein the scanning image display device displays an image on screen by controlling emission of the laser sources and scanning of the scanning mirror synchronously.

16. A scanning image display device comprising the laser source module according to claim 8 and a scanning mirror capable of scanning a reflection direction of a laser beam aligned on the combined beam optical axis in two axis directions, wherein the scanning image display device displays an image on screen by controlling emission of the laser sources and scanning of the scanning mirror synchronously.

17. The laser source module according to the claim 1, wherein the operating condition is a temperature of the laser source module.

18. The laser source module according to the claim 1, wherein the optical axes of the laser beams decenter according to the expansion of the heat sink.

19. The laser source module according to the claim 1, wherein the beam combining unit has a first mirror and a second mirror, and
wherein the laser beams are aligned by transmitting one of the laser beams through the first mirror and reflecting another one of the laser beams by the second mirror.

20. The laser source module according to the claim 1, wherein the heat sinks and the laser chips of in each of the at least two of the laser sources are provided adjacently in a direction approximately orthogonal to the single combined beam optical axis.

21. The laser source module according to the claim 1, wherein the mounting structure of the laser chips to the heat sinks is asymmetrical according to the optical axis of each of the respective laser beams in the at least two of the laser sources.

22. The laser source module according to the claim 4, wherein the operating condition is a temperature of the laser source module.

23. The laser source module according to the claim 4, wherein the optical axes of the laser beams decenter according to the expansion of the heat sinks.

24. The laser source module according to the claim 4, wherein the beam combining unit has a first mirror and a second mirror, and wherein the laser beams are aligned by transmitting one of the laser beams through the first mirror and reflecting another one of the laser beams by the second mirror.

25. The laser source module according to the claim 4, wherein the heat sinks and the laser chips of in each of the at least two of the laser beam sources are provided adjacently in a direction approximately orthogonal to the single combined beam optical axis.

26. The laser source module according to the claim 4, wherein the mounting structure of the laser chips to the heat sinks of the at least two of the laser beam sources is asymmetrical according to the optical axis.

27. The laser source module according to the claim 1, wherein, in the at least two of the laser sources, the laser chip and the heat sink have different coefficients of thermal expansion.

28. The laser source module according to the claim 1, wherein, in each of the laser sources, the laser chip and the heat sink have different coefficients of thermal expansion.

29. The laser source module according to the claim 4, wherein, in the at least two of the laser beam sources, the laser chip and the heat sink have different coefficients of thermal expansion.

30. The laser source module according to the claim 4, wherein, in each of the first laser beam source, second laser beam source, and third laser beam source, the laser chip and the heat sink have different coefficients of thermal expansion.

* * * * *